(12) United States Patent
Sakanishi

(10) Patent No.: US 11,279,905 B2
(45) Date of Patent: Mar. 22, 2022

(54) SEMICONDUCTOR SUBSTRATE CLEANING AGENT

(71) Applicant: DAICEL CORPORATION, Osaka (JP)

(72) Inventor: Yuichi Sakanishi, Tokyo (JP)

(73) Assignee: DAICEL CORPORATION, Osaka (JP)

( * ) Notice: Subject to any disclaimer, the term of this patent is extended or adjusted under 35 U.S.C. 154(b) by 161 days.

(21) Appl. No.: 16/478,436

(22) PCT Filed: Dec. 28, 2017

(86) PCT No.: PCT/JP2017/047177
§ 371 (c)(1),
(2) Date: Jul. 16, 2019

(87) PCT Pub. No.: WO2018/135290
PCT Pub. Date: Jul. 26, 2018

(65) Prior Publication Data
US 2021/0130749 A1 May 6, 2021

(30) Foreign Application Priority Data
Jan. 17, 2017 (JP) .............................. JP2017-006051

(51) Int. Cl.
| | | |
|---|---|---|
| *C11D 7/32* | (2006.01) | |
| *C11D 11/00* | (2006.01) | |
| *C11D 1/72* | (2006.01) | |
| *C11D 3/30* | (2006.01) | |
| *C11D 3/39* | (2006.01) | |
| *C11D 17/08* | (2006.01) | |
| *H01L 21/02* | (2006.01) | |
| *H01L 21/304* | (2006.01) | |

(52) U.S. Cl.
CPC .......... *C11D 11/0047* (2013.01); *C11D 1/72* (2013.01); *C11D 3/30* (2013.01); *C11D 3/3942* (2013.01); *C11D 17/08* (2013.01); *H01L 21/02074* (2013.01); *H01L 21/304* (2013.01)

(58) Field of Classification Search
CPC ................................................. C11D 11/0047
USPC ........................................................ 510/175
See application file for complete search history.

(56) References Cited

U.S. PATENT DOCUMENTS

| | | | |
|---|---|---|---|
| 6,730,644 B1 | 5/2004 | Ishikawa et al. | |
| 7,084,097 B2 | 8/2006 | Ishikawa et al. | |
| 7,375,066 B2 | 5/2008 | Kakizawa et al. | |
| 7,503,982 B2 | 3/2009 | Abe et al. | |
| 7,851,426 B2 | 12/2010 | Nishiwaki | |
| 9,081,291 B2 | 7/2015 | Park et al. | |
| 9,920,287 B2 | 3/2018 | Hayama et al. | |
| 10,176,979 B2 | 1/2019 | Liu et al. | |
| 2002/0111283 A1* | 8/2002 | Argentieri | C11D 7/30 510/167 |
| 2003/0083214 A1 | 5/2003 | Kakizawa et al. | |
| 2004/0167047 A1 | 8/2004 | Ishikawa et al. | |
| 2004/0204329 A1 | 10/2004 | Abe et al. | |
| 2005/0282718 A1* | 12/2005 | Nakagawa | C11D 3/37 510/175 |
| 2008/0173328 A1 | 7/2008 | Nishiwaki | |
| 2009/0151755 A1* | 6/2009 | Beck | C11D 3/3723 134/42 |
| 2010/0298199 A1* | 11/2010 | Ozeki | C11D 1/72 510/334 |
| 2012/0181248 A1 | 7/2012 | Park et al. | |
| 2013/0225464 A1* | 8/2013 | Harada | C11D 11/0047 510/175 |
| 2015/0337245 A1 | 11/2015 | Hayama et al. | |
| 2016/0020087 A1 | 1/2016 | Liu et al. | |
| 2016/0254139 A1* | 9/2016 | Kamimura | C11D 7/265 510/176 |
| 2018/0166273 A1* | 6/2018 | Huang | C11D 17/0013 |
| 2019/0249122 A1 | 8/2019 | Uchida | |
| 2019/0301028 A1 | 10/2019 | Chen | |
| 2019/0382697 A1* | 12/2019 | Uchida | C11D 3/3773 |

FOREIGN PATENT DOCUMENTS

| | | |
|---|---|---|
| EP | 3 062 337 A1 | 8/2016 |
| JP | 2001-7071 A | 1/2001 |
| JP | 2003-289060 A | 10/2003 |
| JP | WO2001/071789 A1 | 3/2004 |

(Continued)

OTHER PUBLICATIONS

International Search Report for PCT/JP2017/047177 (PCT/ISA/210) dated Feb. 13, 2018.

(Continued)

*Primary Examiner* — Gregory E Webb
(74) *Attorney, Agent, or Firm* — Birch, Stewart, Kolasch & Birch, LLP

(57) ABSTRACT

To provide a cleaning agent that can remove impurities such as metal polishing dust adhering to a semiconductor substrate without corroding metal and can prevent re-adhesion of the impurities.
The semiconductor substrate cleaning agent of the present invention contains at least the following component (A) and component (B):
Component (A): a water-soluble oligomer having a weight average molecular weight of not less than 100 and less than 10000; and
Component (B): water.
It is preferable that the water-soluble oligomer is at least one compound selected from compounds represented by the following formulas (a-1) to (a-3).

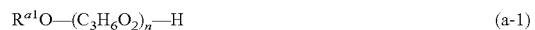

$$R^{a1}O\text{—}(C_3H_6O_2)_n\text{—}H \qquad (a\text{-}1)$$

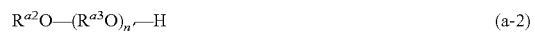

$$R^{a2}O\text{—}(R^{a3}O)_n\text{—}H \qquad (a\text{-}2)$$

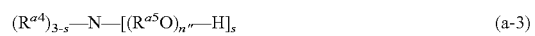

$$(R^{a4})_{3-s}\text{—}N\text{—}[(R^{a5}O)_{n'}\text{—}H]_s \qquad (a\text{-}3)$$

17 Claims, No Drawings

(56) References Cited

FOREIGN PATENT DOCUMENTS

| | | | |
|---|---|---|---|
| JP | 2004-307725 | A | 11/2004 |
| JP | 2008-66658 | A | 3/2008 |
| JP | 2012-227291 | A | 11/2012 |
| JP | 2013-501958 | A | 1/2013 |
| JP | 2014-101476 | A | 6/2014 |
| JP | 2015-512971 | A | 4/2015 |
| JP | 2015-109423 | A | 6/2015 |
| JP | 2016-171294 | A | 9/2016 |
| JP | 2018-49992 | A | 3/2018 |
| JP | 2018-78287 | A | 5/2018 |

OTHER PUBLICATIONS

Written Opinion of the International Searching Authority for PCT/JP2017/047177 (PCT/ISA/237) dated Feb. 13, 2018.
International Preliminary Report on Patentability and English translation of the Written Opinion of the International Searching Authority (Forms PCT/IB/338, PCT/IB/373 and PCT/ISA/237) for Application No. PCT/JP2017/047177, dated Aug. 1, 2019.
Japanese Office Action for Japanese Application No. 2018-663260, dated Jan. 4, 2022.

* cited by examiner

SEMICONDUCTOR SUBSTRATE CLEANING AGENT

TECHNICAL FIELD

The present invention relates to a cleaning agent used for application removing impurities such as metal polishing dust adhering to a semiconductor substrate. The present application claims priority of Japanese Patent Application No. 2017-006051 filed in Japan on Jan. 17, 2017, the content of which is herein incorporated by reference.

BACKGROUND ART

High integration of a semiconductor device has progressed, and a multilayer wiring structure in which lots of layers of metal wiring are laminated is formed on the surface of semiconductor substrate. For example, in order to laminate copper wiring to be a multilayer, a damascene method has been mainly adopted in which copper is deposited on an insulating film with recesses having a wiring pattern configuration by a plating method etc. and then copper deposited on portions other than the recesses is removed by flattening the surface by chemical mechanical polishing (CMP) using an abradant etc.

Although the semiconductor substrate after CMP is polluted with impurities such as metal polishing dust and an abradant, the impurities cause short circuit of wiring and an increase in electrical resistance and therefore need to be completely removed.

As a removal method of the above-mentioned impurities, cleaning methods with an acidic cleaning agent (for example, fluoric acid) or an alkaline cleaning agent (for example, an ammonia aqueous solution) are known. However, the above-mentioned acidic cleaning agent and alkaline cleaning agent may corrode a metal wiring. When the cleaning is performed till the impurities are removed completely, since corrosion of the metal wiring proceeds, it was difficult to satisfy both detergence of the impurity and a corrosion prevention property of the metal wiring.

Patent Literature 1 describes a cleaning agent containing an organic acid compound such as an oxalic acid. Patent Literature 2 describes cleaning agent containing amine. Patent Literature 3 describes a cleaning agent containing: an aliphatic polycarboxylic acid such as oxalic acid and malonic acid; and a polyvalent alcohol or its monoether bodies. Furthermore, Patent Literature 4 describes a cleaning agent containing an ethylene oxide type surfactant, water, and an organic acid or a base. In any of these cleaning agents, it is stated that impurities can be removed without corroding metal. However, since impurities removed by the above-mentioned cleaning agent is easily re-adhered to a semiconductor substrate, even if cleaning is performed using the above-mentioned cleaning agent, there has been a problem in that an effect of preventing short circuit of wiring and an increase in electrical resistance is not fully obtained.

CITATION LIST

Patent Literature

Patent Literature 1: Japanese Patent Laid-Open No. 2001-07071

Patent Literature 2: Domestic Re-publication of PCT International Publication for Patent Applications No. 2001-71789

Patent Literature 3: Japanese Patent Laid-Open No. 2004-307725

Patent Literature 4: Japanese Patent Laid-Open No. 2003-289060

SUMMARY OF INVENTION

Technical Problem

Therefore, the object of the present invention is to provide a cleaning agent that can remove impurities such as metal polishing dust adhering to a semiconductor substrate without corroding metal and can prevent re-adhesion of the above-mentioned impurities.

Solution to Problem

The present inventor has earnestly studied in order to solve the above-mentioned problem and has consequently found that a cleaning agent containing the following components can remove impurities such as metal polishing dust adhering to a semiconductor substrate without corroding metal forming wiring and the like and can prevent re-adhesion of the impurities. The present invention has been completed based on these findings.

That is, the present invention provides a semiconductor substrate cleaning agent containing at least the following component (A) and component (B): Component (A): a water-soluble oligomer having a weight average molecular weight of not less than 100 and less than 10000; and Component (B): water.

Moreover, the present invention provides the semiconductor substrate cleaning agent in which the component (A) is at least one compound selected from a compound represented by the following formula (a-1), a compound represented by the following formula (a-2), and a compound represented by the following formula (a-3):

$$R^{a1}O—(C_3H_6O_2)_n—H \qquad (a\text{-}1)$$

wherein $R^{a1}$ denotes a hydrogen atom, a hydrocarbon group having 1 to 18 carbon atoms that may have a hydroxyl group, or an acyl group having 2 to 24 carbon atoms; and n denotes a mean degree of polymerization of the glycerol unit shown in the parentheses and is an integer of 2 to 60;

$$R^{a2}O—(R^{a3}O)_{n'}—H \qquad (a\text{-}2)$$

wherein $R^{a2}$ denotes a hydrogen atom, a hydrocarbon group having 1 to 18 carbon atoms, or an acyl group having 2 to 24 carbon atoms; $R^{a3}$ denotes an ethylene group or a propylene group; and n' denotes a mean degree of polymerization of the ethylene oxide unit or the propylene oxide unit shown in the parentheses and is an integer of 2 to 60; and $$(R^{a4})_{3-s}—N—[(R^{a5}O)_{n''}—H]_s \qquad (a\text{-}3)$$

wherein $R^{a4}$ denotes an alkyl group having 1 to 20 carbon atoms; $R^{a5}$ denotes an ethylene group or a propylene group; n" denotes a mean degree of polymerization of the ethylene oxide unit or the propylene oxide unit shown in the round brackets and is an integer of 3 to 15; s denotes 1 or 2; and when s is 1, two $R^{a4}$ may be identical or different, and when s is 2, the two groups in the square brackets may be identical or different.

The present invention also provides the semiconductor substrate cleaning agent in which the content of component (A) is not less than 0.1% by weight relative to the total amount of the semiconductor substrate cleaning agent.

The present invention also provides the semiconductor substrate cleaning agent in which the chloride ion content is 0.01 to 50 ppm.

The present invention also provides the semiconductor substrate cleaning agent containing the following component (C):
Component (C): amine.

The present invention also provides the semiconductor substrate cleaning agent in which the component (C) is an alkanolamine represented by the following formula (c5):

[Formula 1]

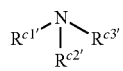

(c5)

wherein $R^{c1'}$ and $R^{c2'}$, which are identical or different, are a hydrogen atom or an aliphatic hydrocarbon group; and $R^{c3'}$ is an aliphatic hydrocarbon group having a hydroxyl group.

The present invention also provides the semiconductor substrate cleaning agent in which the content of component (C) is 0.1 to 2.0 parts by weight relative to 1 part by weight of component (A).

The present invention also provides the semiconductor substrate cleaning agent containing 0.1 to 3.0 parts by weight of the following component (D) relative to 1 part by weight of component (A): Component (D): hydrogen peroxide.

The present invention also provides a method of producing a semiconductor device, comprising producing a semiconductor device having a multilayer wiring structure by repeating the following steps:
Step (1): forming a metal wiring via an interlayer insulation film on a semiconductor substrate;
Step (2): subjecting the metal wiring forming surface of the semiconductor substrate to a flattening treatment; and
Step (3): cleaning the semiconductor substrate subjected to the flattening treatment using the above-mentioned semiconductor substrate cleaning agent.

Advantageous Effects of Invention

The semiconductor substrate cleaning agent of the present invention has the above-mentioned configuration and can therefore remove impurities such as metal polishing dust adhering to a semiconductor substrate without corroding metal forming a wiring and the like and can prevent re-adhesion of the removed impurities. For this reason, in the case of cleaning using the semiconductor substrate cleaning agent of the present invention, remaining of the impurities on the semiconductor substrate can be controlled to a very low level or prevented.

When the semiconductor substrate cleaning agent of the present invention is used to clean a semiconductor substrate, it is possible to prevent short circuit of wiring and an increase in electrical resistance that have been caused so far by a residue of the impurities, to prevent a decrease in yield, and to efficiently produce a semiconductor device with high accuracy.

DESCRIPTION OF EMBODIMENTS

[Semiconductor Substrate Cleaning Agent]

The semiconductor substrate cleaning agent of the present invention contains at least the following component (A) and component (B):
Component (A): a water-soluble oligomer having a weight average molecular weight of not less than 100 and less than 10000; and
Component (B): water.

The semiconductor substrate cleaning agent of the present invention can further contain at least one selected from the following component (C) and component (D):
Component (C): amine; and
Component (D): hydrogen peroxide.

(Component (A))

The component (A) in the present invention is a water-soluble oligomer. The weight average molecular weight of the above-mentioned water-soluble oligomer is not less than 100 and less than 10000, preferably 300 to 8000, and more preferably 500 to 6000. The water-soluble oligomer having a weight average molecular weight within the above-mentioned range is especially excellent in adhesion to a semiconductor substrate surface and exerts an excellent effect of prevention of re-adhesion of impurities. The weight average molecular weight in this specification is a molecular weight measured by gel permeation chromatography (GPC) in terms of standard polystyrene.

In an environment of room temperature and barometric pressure, the solubility of the above-mentioned water-soluble oligomer is, for example, at least 1 g per 100 g of water.

Examples of the above-mentioned water-soluble oligomer include a compound represented by the following formula (a-1), a compound represented by the following formula (a-2), a compound represented by the following formula (a-3), an alkyl amine lactic acid oligomer or derivatives thereof, a (meth)acrylic acid oligomer or derivatives thereof, an acrylic amide oligomer or derivatives thereof, and a saponified product of vinyl acetate oligomer or derivatives thereof. These can be used singly or in combinations of two or more.

In particular, as for the above-mentioned water-soluble oligomer, at least one compound selected from a compound represented by the following formula (a-1), a compound represented by the following formula (a-2), and a compound represented by the following formula (a-3) is preferable. The reason is that these compounds have a surface activity action and improve wettability of a cleaning agent so that impurities can be efficiently removed, and they excel in the re-adhesion prevention effect of impurities.

$$R^{a1}O-(C_3H_6O_2)_n-H \quad (a\text{-}1)$$

wherein $R^{a1}$ denotes a hydrogen atom, a hydrocarbon group having 1 to 18 carbon atoms which may have a hydroxyl group, or an acyl group having 2 to 24 carbon atoms; and n denotes a mean degree of polymerization of the glycerol unit shown in the parentheses and is an integer of 2 to 60.

$$R^{a2}O-(R^{a3}O)_{n'}-H \quad (a\text{-}2)$$

wherein $R^{a2}$ denotes a hydrogen atom, a hydrocarbon group having 1 to 18 carbon atoms, or an acyl group having 2 to 24 carbon atoms; $R^{a3}$ denotes an ethylene group or a propylene group; and n' denotes a mean degree of polymerization of the ethylene oxide unit or the propylene oxide unit shown in the parentheses and is an integer of 2 to 60.

$$(R^{a4})_{3-s}-N-[(R^{a5}O)_{n''}-H]_s \quad (a\text{-}3)$$

wherein $R^{a4}$ denotes an alkyl group having 1 to 20 carbon atoms; $R^{a5}$ denotes an ethylene group or a propylene group; n" denotes a mean degree of polymerization of the ethylene oxide unit or the propylene oxide unit shown in the round brackets and is an integer of 3 to 15; s denotes 1 or 2; and when s is 1, two $R^{a4}$ may be identical or different, and when s is 2, the two groups in the square brackets may be identical or different.

(Compound Represented by Formula (a-1))

$$R^{a1}O-(C_3H_6O_2)_n-H \qquad (a\text{-}1)$$

wherein $R^{a1}$ denotes a hydrogen atom, a hydrocarbon group having 1 to 18 carbon atoms that may have a hydroxyl group, or an acyl group having 2 to 24 carbon atoms; and n denotes a mean degree of polymerization of the glycerol unit shown in the parentheses and is an integer of 2 to 60.

$C_3H_6O_2$ in the parentheses of the formula (a-1) has a structure represented by the following formula (1) and/or (2):

$$-CH_2-CHOH-CH_2O- \qquad (1)$$

$$-CH(CH_2OH)CH_2O- \qquad (2).$$

The hydrocarbon group having 1 to 18 carbon atoms includes an alkyl group having 1 to 18 carbon atoms, an alkenyl group having 2 to 18 carbon atoms, an alkapolyenyl group having 2 to 18 carbon atoms, an alicyclic hydrocarbon group having 3 to 18 carbon atoms, an aromatic hydrocarbon group having 6 to 18 carbon atoms, and a group in which two or more of these are linked.

Examples of the above-mentioned alkyl group having 1 to 18 carbon atoms include a linear or branched chain alkyl group such as a methyl, ethyl, n-propyl, 2-methyl-1-propyl, n-butyl, t-butyl, 3,3-dimethyl-2-butyl, n-pentyl, isopentyl, t-amyl, n-hexyl, 2-ethylhexyl, n-octyl, isooctyl, n-decyl, 4-decyl, isodecyl, dodecyl (=n-lauryl), isododecyl, tetradecyl (=myristyl), isomyristyl, n-hexyldecyl, 2-hexyldecyl, cetyl, isocetyl, stearyl, and isostearyl group. Among these, a linear or branched chain alkyl group having 8 to 18 carbon atoms is preferable.

Examples of the above-mentioned alkenyl group having 2 to 18 carbon atoms include a linear or branched chain alkenyl group such as a vinyl, allyl, 2-butenyl, propenyl, hexenyl, 2-ethylhexenyl, and oleyl group.

Examples of the above-mentioned alkapolyenyl group having 2 to 18 carbon atoms include: alkadienyl groups such as a butadienyl, pentadienyl, hexadienyl, heptadienyl, octadienyl, linoleyl, and linolyl group; an alkatrienyl group such as 1,2,3-pentatrienyl; and an alkatetraenyl group.

Examples of the above-mentioned alicyclic hydrocarbon group having 3 to 18 carbon atoms include a saturated or unsaturated alicyclic hydrocarbon group (especially a cycloalkyl group and a cycloalkenyl group) such as a cyclobutyl, cyclopentyl, cyclohexyl, cyclooctyl, cyclododecyl, 2-cycloheptenyl, and 2-cyclohexenyl group.

Examples of the above-mentioned aromatic hydrocarbon group having 6 to 18 carbon atoms include a phenyl group and a naphthyl group.

Examples of a group in which two or more of the above-mentioned groups are linked include a benzyl, 2-phenylethenyl, 1-cyclopentylethyl, 1-cyclohexylethyl, cyclohexylmethyl, 2-cyclohexylethyl, and 1-cyclohexyl-1-methylethyl group.

The above-mentioned acyl group having 2 to 24 carbon atoms includes an aliphatic acyl group and an aromatic acyl group. Examples of the aliphatic acyl group include a saturated or unsaturated aliphatic acyl group such as an acetyl, propionyl, butyryl, isobutyryl, stearoyl, and oleoyl group. Examples of the aromatic acyl group include a benzoyl, toluoyl, and naphthoyl group.

In particular, it is preferable that $R^{a1}$ is a hydrogen atom, a linear or branched chain alkyl group (among them, a linear or branched chain alkyl group having 8 to 18 carbon atoms, especially a linear or branched chain alkyl group having 10 to 18 carbon atoms), a linear or branched chain alkenyl group (among them, a linear or branched chain alkenyl group having 2 to 18 carbon atoms, especially a linear or branched chain alkenyl group having 2 to 8 carbon atoms), or an aliphatic acyl group (especially a saturated aliphatic acyl group having 10 to 18 carbon atoms). A hydrogen atom, the above-mentioned alkyl group, or the above-mentioned alkenyl group is especially preferable.

In the formula (a-1), n denotes a mean degree of polymerization of the glycerol unit shown in the parentheses. The value of n is an integer of 2 to 60, and the lower limit value of n is preferably 5, more preferably 10, further preferably 15, especially preferably 20, most preferably 25, and most especially preferably 30. The upper limit value of n is preferably 55, more preferably 50, especially preferably 45, and most preferably 40. The compound represented by the formula (a-1) in which the value of n is in the above-mentioned range easily adheres to a semiconductor substrate surface to form a coating. The coating can prevent re-adhesion of impurities once removed from the semiconductor substrate surface, and remaining of the impurities on the semiconductor substrate surface can be controlled to a very low level or prevented.

The weight average molecular weight of the compound represented by the formula (a-1) is not less than 100 and less than 10000, preferably 300 to 8000, more preferably 500 to 6000, especially preferably 1000 to 5000, and most preferably 2000 to 4000.

As the compound represented by the formula (a-1), it is preferable to use at least one selected from the compounds represented by the following formulas:

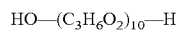
$$HO-(C_3H_6O_2)_{10}-H$$

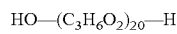
$$HO-(C_3H_6O_2)_{20}-H$$

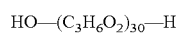
$$HO-(C_3H_6O_2)_{30}-H$$

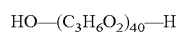
$$HO-(C_3H_6O_2)_{40}-H$$

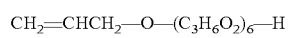
$$CH_2=CHCH_2-O-(C_3H_6O_2)_6-H$$

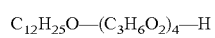
$$C_{12}H_{25}O-(C_3H_6O_2)_4-H$$

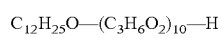
$$C_{12}H_{25}O-(C_3H_6O_2)_{10}-H$$

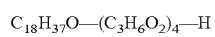
$$C_{18}H_{37}O-(C_3H_6O_2)_4-H$$

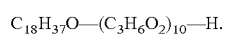
$$C_{18}H_{37}O-(C_3H_6O_2)_{10}-H.$$

Of the compound represented by the formula (a-1), as polyglycerol (i.e. a compound in which $R^{a1}$ in the formula is a hydrogen atom), for example, commercial products such as trade names: "PGL 03P" (poly (3) glycerol), "PGL 06" (poly (6) glycerol), "PGL 10PSW" (poly (10) glycerol), "PGL 20PW" (poly (20) glycerol), and "PGL XPW" (poly (40) glycerol) (these are manufactured by Daicel Corporation) can be preferably used.

Of the compound represented by the formula (a-1), polyglycerol derivatives (i.e. compounds in which $R^{a1}$ in the formula is a hydrocarbon group having 1 to 18 carbon atoms that may have a hydroxyl group, or an acyl group having 2 to 24 carbon atoms) can be produced using various methods. Examples of a method of producing a polyglycerol derivative include the following methods and the like, but the polyglycerol derivative in the present invention is not limited to one produced by the methods:

(1) a method of performing addition polymerization of 2,3-epoxy-1-propanol to $R^{a1}OH$ ($R^{a1}$ is the same as above); and (2) a method of condensing polyglycerol with an alkyl halide (for example, $R^{a1'}X$: X denotes a halogen atom; and $R^{a1'}$ denotes a hydrocarbon group having 1 to 18 carbon atoms), a carboxylic acid (for example, $R^{a1''}OH$: $R^{a1''}$ denotes an acyl group having 2 to 24 carbon atoms), or a derivative thereof (for example, a carboxylic halide, an acid anhydride, etc.).

It is preferable to carry out the addition reaction in the above-mentioned method (1) in the presence of an alkali catalyst. Examples of the alkali catalyst include sodium hydroxide, potassium hydroxide, lithium hydroxide, metallic sodium, and sodium hydride. These can be used singly or in combinations of two or more.

For polyglycerol used as a raw material in the above-mentioned method (2), the above-mentioned commercial products are preferably used.

(Compound Represented by Formula (a-2))

$$R^{a2}O—(R^{a3}O)_{n'}—H \qquad (a\text{-}2)$$

wherein $R^{a2}$ denotes a hydrogen atom, a hydrocarbon group having 1 to 18 carbon atoms, or an acyl group having 2 to 24 carbon atoms; $R^{a3}$ denotes an ethylene group or a propylene group; and n' denotes a mean degree of polymerization of the ethylene oxide unit or the propylene oxide unit shown in the parentheses and is an integer of 2 to 60.

The hydrocarbon group having 1 to 18 carbon atoms and an acyl group having 2 to 24 carbon atoms for $R^{a2}$ in the formula (a-2) include the same examples as for the above-mentioned $R^{a1}$.

In particular, it is preferable that the hydrocarbon group having 1 to 18 carbon atoms for $R^{a2}$ includes: a linear or branched alkyl group having 8 to 18 (especially preferably 8 to 15 and most preferably 10 to 15) carbon atoms, such as a lauryl group, a myristyl group and a stearyl group; and a linear or branched alkenyl group having 8 to 20 (especially preferably 8 to 15 and most preferably 10 to 15) carbon atoms, such as an oleyl group.

In particular, n' is preferably 6 to 12 and especially preferably 8 to 10.

The weight average molecular weight of the compound represented by the formula (a-2) is not less than 100 and less than 10000, preferably 500 to 8000, more preferably 1000 to 7000, especially preferably 2000 to 7000, and most preferably 3000 to 7000.

Moreover, especially when the compound represented by the formula (a-2) is used together with the compound represented by the above-mentioned formula (a-1), the weight average molecular weight thereof is preferably not less than 100 and less than 1000 and more preferably 100 to 800.

Specifically, the compound represented by the formula (a-2) includes: an ethylene oxide adduct of a saturated alcohol (a primary alcohol or a secondary alcohol) such as methanol, ethanol, 1-propanol, 2-propanol, 1-butanol, 2-butanol, octanol, lauryl alcohol, 2-dodecanol, 1-tridecanol, 2-tridecanol, myristyl alcohol, 2-tetradecanol, and stearyl alcohol; and an ethylene oxide adduct of an unsaturated alcohol (a primary alcohol or a secondary alcohol) such as oleyl alcohol and linolyl alcohol.

(Compound Represented by Formula (a-3))

$$(R^{a4})_{3-s}—N—[(R^{a5}O)_{n''}—H]_s \qquad (a\text{-}3)$$

wherein $R^{a4}$ denotes an alkyl group having 1 to 20 carbon atoms; $R^{a5}$ denotes an ethylene group or a propylene group; n'' denotes a mean degree of polymerization of the ethylene oxide unit or the propylene oxide unit shown in the round brackets and is an integer of 3 to 15; s denotes 1 or 2; and when s is 1, two $R^{a4}$ may be identical or different, and when s is 2, the two groups in the square brackets may be identical or different.

$R^{a4}$ in the formula (a-3) denotes an alkyl group having 1 to 20 carbon atoms and examples include a linear or branched alkyl group such as a methyl, ethyl, n-propyl, 2-methyl-1-propyl, n-butyl, t-butyl, 3,3-dimethyl-2-butyl, n-pentyl, isopentyl, t-amyl, n-hexyl, 2-ethylhexyl, n-octyl, isooctyl, n-decyl, 4-decyl, isodecyl, dodecyl (=n-lauryl), isododecyl, tetradecyl (=myristyl), isomyristyl, n-hexyldecyl, 2-hexyldecyl, cetyl, isocetyl, stearyl, and isostearyl groups.

Examples of the compound represented by the formula (a-3) include ethylene oxide adducts of monoalkylamines such as butylamine, hexylamine, octylamine, decylamine, undecylamine, dodecylamine, tridecylamine, tetradecylamine, and coconut amine; and ethylene oxide adducts of dialkylamines such as propylmethylamine, butylmethylamine, diethylamine, propylethylamine, butylethylamine, dipropylamine, and butylpropylamine.

The weight average molecular weight of the compound represented by the formula (a-3) is not less than 100 and less than 10000, preferably 500 to 8000, more preferably 1000 to 7000, especially preferably 2000 to 7000, and most preferably 3000 to 7000.

The content (the total content when two or more kinds are contained) of the component (A) in the semiconductor substrate cleaning agent of the present invention is, for example, not less than 0.1% by weight, preferably 0.1 to 5% by weight, more preferably 0.1 to 3% by weight, especially preferably 0.1 to 2% by weight, and most preferably 0.2 to 1% by weight, relative to the total amount of the semiconductor substrate cleaning agent.

It is preferable that the semiconductor substrate cleaning agent of the present invention contains at least the compound represented by the formula (a-1) and/or the compound represented by the formula (a-2) as the component (A).

The rate of the content of the compound represented by the formula (a-1) is, for example, not less than 60% by weight, preferably not less than 70% by weight, especially preferably not less than 80% by weight, and most preferably not less than 90% by weight, relative to the total amount of the component (A).

Therefore, the content of the compound represented by the formula (a-1) is, for example, not less than 0.1% by weight, preferably 0.1 to 5% by weight, more preferably 0.1 to 3% by weight, especially preferably 0.1 to 2% by weight, and most preferably 0.2 to 1% by weight, relative to the total amount of the semiconductor substrate cleaning agent.

The rate of the content of the compound represented by the formula (a-2) (preferably a compound represented by the formula (a-2) and having a weight average molecular weight of not less than 1000 and less than 10000 (preferably not less than 800 and less than 10000)) is, for example, not less than 60% by weight, preferably not less than 70% by weight, especially preferably not less than 80% by weight, and most preferably not less than 90% by weight, relative to the total amount of the component (A) contained in the semiconductor substrate cleaning agent of the present invention.

Therefore, the content of the compound represented by the formula (a-2) (preferably a compound represented by the formula (a-2) and having a weight average molecular weight of not less than 1000 and less than 10000 (preferably not less than 800 and less than 10000)) is, for example, not less than 0.1% by weight, preferably 0.1 to 5% by weight, more preferably 0.1 to 3% by weight, especially preferably 0.1 to 2% by weight, and most preferably 0.2 to 1% by weight, relative to the total amount of the semiconductor substrate cleaning agent.

The rate of the total content of the compound represented by the formula (a-1) and the compound represented by the formula (a-2) is, for example, not less than 60% by weigh, preferably not less than 70% by weight, especially preferably not less than 80% by weight, and most preferably not less than 90% by weight, relative to the total amount of the component (A) contained in the semiconductor substrate cleaning agent of the present invention.

Therefore, the total content of the compound represented by the formula (a-1), and the compound represented by the formula (a-2) is, for example, not less than 0.1% by weight, preferably 0.1 to 5% by weight, more preferably 0.1 to 3% by weight, especially preferably 0.1 to 2% by weight, and most preferably 0.2 to 1% by weight, relative to the total amount of the semiconductor substrate cleaning agent.

In particular, when the compound represented by the formula (a-1) and the compound represented by the formula (a-2) and having a weight average molecular weight of not less than 100 and less than 1000 (preferably 100 to 800) are contained as the component (A), the content of the compound represented by the formula (a-2) and having a weight average molecular weight of not less than 100 and less than 1000 (preferably 100 to 800) is, for example, 0.01 to 0.50 parts by weight, preferably 0.05 to 0.5 parts by weight, and especially preferably 0.05 to 0.3 parts by weight, relative to 1 part by weight of the compound represented by the formula (a-1).

Moreover, the content of the compound represented by the formula (a-2) and having a weight average molecular weight of not less than 100 and less than 1000 (preferably 100 to 800) is, for example, 0.001 to 0.3% by weight, preferably 0.001 to 0.2% by weight, especially preferably 0.001 to 0.1% by weight, and most preferably 0.001 to 0.01% by weight, relative to the total amount of the semiconductor substrate cleaning agent.

Moreover, the semiconductor substrate cleaning agent of the present invention may contain polyglycerol diether and polyglycerol diester corresponding to the compound represented by the formula (a-1). In this case, the rate of the content of the compound represented by the formula (a-1) to the total content of the compound represented by the formula (a-1) and the corresponding polyglycerol diether and polyglycerol diester is preferably not less than 75% by weight, more preferably not less than 85% by weight, and further preferably not less than 90% by weight. Moreover, the content of the polyglycerol diether or polyglycerol diester corresponding to the compound represented by the above-mentioned formula (a-1) is preferably not more than 5% by weight and especially preferably not more than 1% by weight relative to the total amount of the semiconductor substrate cleaning agent of the present invention. The content rate of each component can be calculated from an area ratio at the time when each component is eluted with a high performance liquid chromatography to calculate a peak area with a differential refractometer detector.

(Component (B))

In the semiconductor substrate cleaning agent of the present invention, water is an essential ingredient. As for water, it is preferable to use water having low electric conductivity (at 25° C.) in terms of being excellent in the removal property of impurities and the re-adhesion prevention property of the impurities. It is preferable to use water having electric conductivity of, for example, 0.055 to 0.2 μS/cm (preferably 0.056 to 0.1 μS/cm, especially preferably 0.057 to 0.08 μS/cm), and it is especially preferable to use ultrapure water. The electric conductivity of water can be measured by the method according to JIS K0552.

The content of water in the semiconductor substrate cleaning agent of the present invention is, for example, 60.0 to 99.9% by weight, preferably 70.0 to 99.9% by weight, more preferably 85.0 to 99.9% by weight, and especially preferably 90.0 to 99.9% by weight relative to the total amount of the semiconductor substrate cleaning agent.

(Component (C))

It is preferable that the semiconductor substrate cleaning agent of the present invention contains one or two or more of amines in terms of being capable of improving the removal efficiency of impurities (especially polishing grains contained in an abradant, etc.). The above-mentioned amine is represented by, for example, the following formula (c):

[Formula 2]

wherein $R^{c1}$ to $R^{c3}$, which are identical or different, denote a hydrogen atom, a hydrocarbon group that may have a hydroxyl group or an amino group, or a group in which two or more of the above-mentioned groups are bonded via a linking group; and two or more groups selected from $R^{c1}$ to $R^{c3}$ may be bonded to each other to form a ring with the nitrogen atom in the formula.

The hydrocarbon group in the above $R^{c1}$ to $R^{c3}$ includes an aliphatic hydrocarbon group, an alicyclic hydrocarbon group, an aromatic hydrocarbon group, and a group in which two or more of these are linked. Among them, an alkyl group having 1 to 6 carbon atoms, an alkenyl group having 2 to 6 carbon atoms, a cycloalkyl or cycloalkenyl group having 3 to 10 carbon atoms, or an aryl group having 6 to 10 carbon atoms is preferable. A substituent group (for example, alkyl group having 1 to 3 carbon atoms) may be bonded to the alicyclic ring or aromatic ring contained in the above-mentioned cycloalkyl group, cycloalkenyl group, and aryl group.

Examples of the above-mentioned linkage group include —O—, —NH—, and —NR$^{c4}$— (R$^{c4}$ denotes a hydrocarbon group and can include the same examples as the hydrocarbon group in the case of $R^{c1}$ to $R^{c3}$).

Examples of the ring that may be formed by mutually bonding two or more groups selected from the above $R^{c1}$ to $R^{c3}$ with the nitrogen atom in the formula include: a 5-membered ring such as a pyrrole ring, a pyrrolidine ring, a pyrazole ring, an imidazole ring, and a triazole ring; and a 6-membered ring such as an isocyanuric ring, a pyridine ring, a pyridazine ring, a pyrimidine ring, a pyrazine ring, a piperidine ring, and a piperazine ring. For the above-mentioned ring, a ring selected from an alicyclic ring, an aromatic ring, an aromatic heterocycle, and a nonaromatic heterocycle may be condensed.

The amine represented by the formula (c) includes an aliphatic amine (c1), an alicyclic amine (c2), an aromatic amine (c3), a heterocyclic amine (c4), and an alkanolamine (c5).

Examples of the above-mentioned aliphatic amine (c1) include: monoalkylamines such as methylamine, ethylamine, propylamine, isopropylamine, and hexylamine; dialkylamines such as dimethylamine, ethylmethylamine, propylmethylamine, butylmethylamine, diethylamine, propylethylamine, and diisopropylamine; trialkylamines such as trimethylamine, ethyldimethylamine, diethylmethylamine, triethylamine, tri-n-propylamine, and tri-n-butylamine; 2-diaminoethane, 1,2-propanediamine, 1,3-propanediamine, 1,4-butanediamine, 1,6-diaminohexane, 1,2-bis(2-aminoethoxy)ethane, triethylenetetramine, tetraethylenepentamine, pentaethylenehexamine, iminobispropylamine, bis(hexamethylene) triamine, and pentaethylenehexamine.

Examples of the above-mentioned alicyclic amine (c2) include isophoronediamine and 1,2-cyclohexanediamine.

Examples of the above-mentioned aromatic amine (c3) include aromatic amines such as aniline, 1,3-phenylenediamine, 2,4-tolylenediamine, 1,3-xylylenediamine, 1,5-naphthalenediamine, and 2,3-anthracenediamine.

Examples of the above-mentioned heterocyclic amine (c4) include piperazine, N-aminoethylpiperazine, 1,4-diaminoethylpiperazine, 1,5-diazabicyclo[4,3,0]non-5-ene, and 1,8-diazabicyclo[5,4,0]undec-7-ene.

Examples of the above-mentioned alkanolamine (c5) include monoethanolamine, diethanolamine, triethanolamine, N,N-dimethyl-2-aminoethanol, N,N-diethyl-2-aminoethanol, 2-amino-2-methyl-1-propanol, N-(aminoethyl)ethanolamine, and 2-(2-aminoethylaminoethanol).

In particular, an alkanolamine (c5) is preferable as the amine represented by the formula (c), and a compound in which $R^{c1}$ to $R^{c3}$ in the formula (c), which are identical or different, are a hydrogen atom or an aliphatic hydrocarbon group (preferably a $C_{1-6}$ aliphatic hydrocarbon group) that may have a hydroxyl group or an amino group and at least one of $R^{c1}$ to $R^{c3}$ is an aliphatic hydrocarbon group (preferably a $C_{1-6}$ aliphatic hydrocarbon group) having a hydroxyl group is especially preferable. Among them, a preferable one is a compound in which $R^{c1}$ to $R^{c3}$ in the formula (c), which are identical or different, are a hydrogen atom or an aliphatic hydrocarbon group (preferably a $C_{1-6}$ aliphatic hydrocarbon group) and at least one of $R^{c1}$ to $R^{c3}$ is an aliphatic hydrocarbon group (preferably a $C_{1-6}$ aliphatic hydrocarbon group) having a hydroxyl group.

Specifically, as an amine represented by the formula (c), alkanolamine represented by the following formula (c5) is preferable:

[Formula 3]

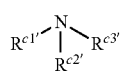

(c5)

wherein $R^{c1'}$ and $R^{c2'}$, which are identical or different, are a hydrogen atom or an aliphatic hydrocarbon group (preferably a $C_{1-6}$ aliphatic hydrocarbon group); and $R^{c3'}$ is an aliphatic hydrocarbon group (preferably $C_{1-6}$ aliphatic hydrocarbon group) having a hydroxyl group.

The content of amine is, for example, 0.2 to 2.0 parts by weight, preferably 0.3 to 1.5 parts by weight, and especially preferably 0.5 to 1.2 parts by weight relative to 1 part by weight of component (A).

The content of amine relative to 1 part by weight of the compound represented by the formula (a-1) is, for example, 0.2 to 2.0 parts by weight, preferably 0.3 to 1.5 parts by weight, and especially preferably 0.5 to 1.2 parts by weight.

Moreover, the content of amine is, for example, not more than 5.0% by weight, preferably 0.01 to 1.0% by weight, especially preferably 0.05 to 0.5% by weight relative to the total amount of the semiconductor substrate cleaning agent.

Moreover, the content of amine is preferably in such a range that the pH value of the semiconductor substrate cleaning agent after adding amine may be, for example, 5.0 to 12.0 (preferably 7.0 to 11.0, further preferably 8.5 to 10.5).

When the semiconductor substrate cleaning agent of the present invention contains amine in the above-mentioned range, it becomes possible to much more quickly remove impurities such as polishing grains adhering to the semiconductor substrate while preventing corrosion of metal, and this is preferable.

(Component (D))

It is preferable that the semiconductor substrate cleaning agent of the present invention contains hydrogen peroxide in terms of being capable of further improving removal efficiency of impurities (especially metal polishing dust).

The content of hydrogen peroxide is, for example, 0.1 to 3.0 parts by weight, preferably 0.2 to 2.0 parts by weight, and especially preferably 0.3 to 1.5 parts by weight relative to 1 part by weight of component (A).

The content of hydrogen peroxide relative to 1 part by weight of the compound represented by the formula (a-1) is, for example, 0.1 to 3.0 parts by weight, preferably 0.2 to 2.0 parts by weight, and especially preferably 0.3 to 1.5 parts by weight.

Moreover, the content of hydrogen peroxide is, for example, not more than 5.0% by weight, preferably 0.01 to 2.0% by weight, and especially preferably 0.05 to 1.0% by weight relative to the total amount of the semiconductor substrate cleaning agent.

When the semiconductor substrate cleaning agent of the present invention contains hydrogen peroxide in the above-mentioned range, it becomes possible to much more quickly remove impurities such as metal polishing dust adhering to the semiconductor substrate while preventing corrosion of metal. When the content of hydrogen peroxide is excessive, it tends to become difficult to prevent corrosion of metal.

(Others)

In the semiconductor substrate cleaning agent of the present invention, it is preferable that the content of chloride ion is, for example, 0.01 to 50 ppm in terms of obtaining an effect of further improving the corrosion prevention property of metal.

The content of chloride ion in the semiconductor substrate cleaning agent of the present invention can be adjusted by, for example, adding a hydrochloric acid aqueous solution.

If necessary, the semiconductor substrate cleaning agent of the present invention may further contain one or two or more of other components [for example, a metal corrosion inhibitor (adenine, adenosine, thiazole, imidazole, etc.), a polyphenol reducing agent (catechol, caffeic acid, alizarine, endocrocin, urushiol, flavone, resorcinol, hydroquinone, emodin, pyrogallol, etc.), and a quaternary ammonium hydroxide (tetramethylammonium hydroxide, tetraethylammonium hydroxide, hydroxyethyltrimethylammonium hydroxide, etc.)].

(Method of Producing Semiconductor Substrate Cleaning Agent)

The semiconductor substrate cleaning agent of the present invention can be prepared by mixing component (A), component (B), and optionally other components (for example, at least one selected from the above-mentioned component (C), component (D), hydrochloric acid, etc.).

Based on the total amount (100% by weight) of the semiconductor substrate cleaning agent of the present invention, the rate of the total content of component (A), component (B), component (C), and component (D) is, for example, not less than 70% by weight, preferably not less than 80% by weight, especially preferably not less than 90% by weight, and most preferably not less than 95% by weight.

The semiconductor substrate cleaning agent of the present invention contains at least component (A) and component (B) so that impurities such as metal polishing dust adhering to a semiconductor substrate can be removed, and re-adhesion of the removed impurities can be prevented. Therefore, when a semiconductor substrate is cleaned using the semiconductor substrate cleaning agent of the present invention, remaining of the impurities can be controlled to a very low level or prevented. Furthermore, the semiconductor substrate cleaning agent of the present invention does not corrode metal. For this reason, the cleaning agent can be preferably used for not only cleaning of a semiconductor substrate that does not have a metal wiring but also cleaning of a semiconductor substrate having a metal wiring.

(Method of Producing Semiconductor Device)

The method of producing a semiconductor device of the present invention comprises producing a semiconductor device having a multilayer wiring structure by repeating the following steps:

Step (1): forming a metal wiring via an interlayer insulation film on a semiconductor substrate;

Step (2): subjecting the metal wiring forming surface of the semiconductor substrate to a flattening treatment; and Step (3): cleaning the semiconductor substrate subjected to the flattening treatment using the semiconductor substrate cleaning agent of the present invention.

Step (1) is a step of forming a metal wiring (Cu wiring, Al wiring, etc.) via an interlayer insulation film on a semiconductor substrate. Examples of a method of forming a metal wiring is not particularly limited but examples include: a method in which a wiring pattern is formed by etching a metal coating with an RIE technique and then an insulating film (for example, a crystalline silicon film, an amorphous silicon film, a silicon oxide film ($SiO_2$ film), and a silicon nitride film (SiN film) is formed between the clearance; and a method in which an insulating film is etched to make recesses having a wiring pattern configuration and then metal is filled in the obtained recesses (damascene method). In the case of forming Cu wiring as a metal wiring, it is preferable to adopt the damascene method.

Step (2) is a step of flattening the metal wiring forming surface of the semiconductor substrate after forming the metal wiring. For the flattening, it is preferable to use CMP (chemical mechanical polishing), e.g. polishing with use of an abradant (slurry) containing organic additives or polishing grains such as alumina and silica. The amount of the abradant used and the polishing speed can be suitably adjusted.

Step (3) is a step of cleaning the semiconductor substrate subjected to the flattening treatment using the semiconductor substrate cleaning agent of the present invention to remove impurities such as polishing dust, which is generated during the flattening treatment, and polishing grains contained in an abradant. Examples of the cleaning method using the semiconductor substrate cleaning agent of the present invention include: a method of storing the semiconductor substrate cleaning agent of the present invention in a tank and then immersing the semiconductor substrate after the flattening treatment into the tank (for example, about 1 to 15 minutes at room temperature); and a method of spraying the semiconductor substrate cleaning agent of the present invention on the semiconductor substrate after the flattening treatment. Moreover, in the case of cleaning using the semiconductor substrate cleaning agent of the present invention, a physical cleaning such as ultrasonic cleaning, brush cleaning, and jet cleaning can be combined to perform the cleaning.

In the method of producing a semiconductor device of the present invention, since a semiconductor substrate is cleaned using the semiconductor substrate cleaning agent of the present invention, even in the case of a semiconductor substrate after forming a metal wiring, it is possible to remove impurities such as metal polishing dust adhering to the semiconductor substrate without corroding a metal wiring and to prevent re-adhesion of the impurities once removed. Therefore, it is possible to prevent the impurities from remaining on the semiconductor substrate.

According to the method of producing a semiconductor device of the present invention, by passing through the step of cleaning a semiconductor substrate using the semiconductor substrate cleaning agent of the present invention, the impurities do not remain on the semiconductor substrate. Thus, it is possible to prevent short circuit of wiring and an increase in electrical resistance which have been caused so far by a residue of the impurities, to prevent a decrease in yield, and to efficiently produce a semiconductor device with high accuracy.

EXAMPLES

Hereafter, the present invention is more specifically explained in Examples, but the present invention is not limited by these Examples.

Examples 1 to 13

The respective components were blended according to the prescription (unit: part by weight) shown in Table 1 to obtain cleaning agents. The resulting cleaning agents did not corrode a metal wiring.

Comparative Examples 1 to 7

The respective components were blended according to the prescription (unit: part by weight) shown in Table 2 to obtain cleaning agents.

For the cleaning agents obtained in the Examples and the Comparative Examples, the metal impurity removal property was evaluated by the following methods.

<Metal Impurity Removal Property-1>

The evaluation of the metal impurity removal property-1 was performed according to the procedure shown below.

(1) Pretreatment of Wafer Having Oxidation Silicon Monolayer Film

A silicon wafer having an silicon oxide monolayer film (trade name "P-TEOS 1.5µ," manufactured by ADVANTEC Co., Ltd., thickness of silicon oxide monolayer film: 1.5 µm) was cut into a chip of 1.0 cm longitudinally and 2.0 cm horizontally, immersed in a 10% acetic acid aqueous solution for 1 minute and then washed with ultrapure water.

(2) Preparation of Aqueous Solution Containing Metal Ion

Water is added to 0.1 g of zinc nitrate, 0.1 g of iron nitrate, and 0.1 g of magnesium nitrate so that the total amount was 100 g to prepare a metal ion aqueous solution containing 0.1% of zinc ion, iron ion, and magnesium ion.

(3) Pollution Treatment of Wafer with Metal Ion Aqueous Solution

The wafer chip pretreated in (1) was immersed in 10 g of the metal ion aqueous solution prepared in (2) for 1 minute and then dried by nitrogen blow to adhere the metal ions to the wafer surface.

(4) Cleaning of Wafer

The pollution-treated wafer chip was immersed in each of 10 g of cleaning solutions obtained in the Examples and the Comparative Examples, left for 3 minutes at 25° C. and then taken out from the cleaning solution.

(5) Measurement of Concentration of Metal Ion Eluted in Cleaning Solution

After the cleaning of wafer, a 0.1% nitric acid aqueous solution was added to 5 g of the cleaning solution from which the wafer was taken out so that the pH value was adjusted to 3.0. Thereafter, ultrapure water was added until the total amount was 10 g, and this was used as a measurement solution.

Concentrations of zinc ion, iron ion, and magnesium ion contained in the obtained measurement solution was measured with an ICP-MS analysis device (an induction coupled plasma mass spectrometer, manufactured by Agilent Technologies, Inc., Agilent 7500cs type), and the metal impurity removal property was judged based on the following criterion:

<Evaluation Criterion>

○ (Very Good): the metal ion concentration is not less than 1.5 ng/cm$^2$

Δ (Good): the metal ion concentration is not less than 0.5 ng/cm$^2$ and less than 1.5 ng/cm$^2$ x (Poor): the metal ion concentration is less than 0.5 ng/cm$^2$ <Metal Impurity Removal Property-2>

The evaluation of the metal impurity removal property-2 was performed by the same method as in <Metal Impurity Removal Property-1> except for using a silicon bare wafer (trade name "Bare wafer," manufactured by ADVANTEC Co., Ltd., thickness of monocrystal silicon monolayer film: 1.5 μm) instead of the silicon wafer having a silicon oxide monolayer film.

TABLE 1

|  |  | Example | | | | | | | | | | | | |
|---|---|---|---|---|---|---|---|---|---|---|---|---|---|
|  |  | 1 | 2 | 3 | 4 | 5 | 6 | 7 | 8 | 9 | 10 | 11 | 12 | 13 |
| Cleaning agent | a-1 | 0.3 | 0.3 | 0.3 | 0.3 | 0.5 | 0.5 | 0.5 | 0.5 | — | — | — | — | — |
|  | a-2 | — | — | — | — | — | — | — | — | 0.3 | — | — | — | — |
|  | a-3 | — | — | — | — | — | — | — | — | — | 0.3 | — | — | — |
|  | a-4 | — | — | — | 0.05 | 0.05 | 0.05 | 0.05 | 0.05 | — | — | 0.05 | 0.05 | 0.05 |
|  | a-5 | — | — | — | — | — | — | — | — | — | — | — | — | — |
|  | a-6 | — | — | — | — | — | — | — | — | — | — | — | — | — |
|  | a-7 | — | — | — | — | — | — | — | — | — | — | — | — | — |
|  | Ultrapure water | 99.38 | 99.4 | 97 | 99.03 | 98.85 | 98.15 | 97.85 | 93.85 | 99.38 | 99.38 | 99.33 | 98.35 | 94.35 |
|  | c-1 | 0.3 | — | 0.2 | 0.3 | — | — | 0.3 | 0.3 | 0.3 | 0.3 | 0.3 | 0.3 | 0.3 |
|  | 30% Hydrogen peroxide solution | — | — | — | 0.3 | 0.3 | 0.3 | 0.3 | 0.3 | — | — | 0.3 | 0.3 | 0.3 |
|  | Hydrochloric acid aqueous solution (100 ppm) | 0.02 | — | — | 0.02 | — | — | — | — | 0.02 | 0.02 | 0.02 | — | — |
|  | Hydrochloric acid aqueous solution (1000 ppm) | — | 0.3 | 2.5 | — | 0.3 | 1 | 1 | 5 | — | — | — | 1 | 5 |
| Chloride ion content in cleaning agent (ppm) |  | 0.02 | 3 | 25 | 0.02 | 3 | 10 | 10 | 50 | — | — | 0.02 | 10 | 50 |
| Evaluation | Metal impurity removal property-1 | ○ | ○ | ○ | ○ | ○ | ○ | ○ | ○ | ○ | ○ | Δ | Δ | Δ |
|  | Metal impurity removal property-2 | ○ | ○ | ○ | ○ | ○ | ○ | ○ | ○ | ○ | ○ | Δ | Δ | Δ |

TABLE 2

|  |  | Comparative Example | | | | | | |
|---|---|---|---|---|---|---|---|---|
|  |  | 1 | 2 | 3 | 4 | 5 | 6 | 7 |
| Cleaning agent | a-1 | — | — | — | — | — | — | — |
|  | a-2 | — | — | — | — | — | — | — |
|  | a-3 | — | — | — | — | — | — | — |
|  | a-4 | — | — | — | — | — | — | — |
|  | a-5 | — | 0.3 | — | — | 0.5 | — | — |
|  | a-6 | — | — | 0.3 | — | — | 0.5 | — |
|  | a-7 | — | — | — | 0.3 | — | — | 0.5 |
|  | Ultrapure water | 97.3 | 99.38 | 99.38 | 99.38 | 99.18 | 99.18 | 99.18 |
|  | c-1 | 0.2 | 0.3 | 0.3 | 0.3 | 0.3 | 0.3 | 0.3 |
|  | 30% Hydrogen peroxide solution | — | — | — | — | — | — | — |
|  | Hydrochloric acid aqueous solution (100 ppm) | — | 0.02 | 0.02 | 0.02 | 0.02 | 0.02 | 0.02 |
|  | Hydrochloric acid aqueous solution (1000 ppm) | 2.5 | — | — | — | — | — | — |
| Chloride ion content in cleaning agent (ppm) |  | 25 | — | — | — | — | — | — |
| Evaluation | Metal impurity removal property-1 | x | x | x | x | x | x | x |
|  | Metal impurity removal property-2 | x | x | x | x | x | x | x |

The symbols in the Tables represent the following compounds:
a-1: Poly (40) glycerol, trade name "PGL XPW," weight average molecular weight: 2981, manufactured by Daicel Corporation
a-2: polyethylene glycol, weight average molecular weight: 6000
a-3: polyethylene glycol, weight average molecular weight: 4000
a-4: 9 mol ethylene oxide adduct of lauryl alcohol, weight average molecular weight: 581
a-5: hydroxyethyl cellulose, weight average molecular weight: 250000
a-6: polyvinylpyrrolidone, weight average molecular weight: 40000
a-7: polyethylene glycol, weight average molecular weight: 20000
c-1: N,N-dimethyl-2-aminoethanol From the Examples, it has been found that the semiconductor substrate cleaning agent of the present invention has both the corrosion prevention property of metal and metal impurity removal property. Therefore, the semiconductor substrate cleaning agent of the present invention can be preferably used for not only cleaning of a semiconductor substrate that does not have a metal wiring but also cleaning of a semiconductor substrate having a metal wiring.

As the conclusion, the configurations of the present invention and its variations will be appended below.

[1] A semiconductor substrate cleaning agent containing at least the following component (A) and component (B): Component (A): a water-soluble oligomer having a weight average molecular weight of not less than 100 and less than 10000; and Component (B): water.

[2] The semiconductor substrate cleaning agent according to [1], wherein the component (A) is at least one compound selected from a compound represented by the formula (a-1), a compound represented by the formula (a-2), and a compound represented by the formula (a-3).

[3] The semiconductor substrate cleaning agent according to [1], wherein the component (A) is the compound represented by the formula (a-1) and/or the compound represented by the formula (a-2).

[4] The semiconductor substrate cleaning agent according to any one of [1] to [3], wherein the content of the component (A) is not less than 0.1% by weight relative to the total amount of the semiconductor substrate cleaning agent.

[5] The semiconductor substrate cleaning agent according to any one of [2] to [4], wherein the rate of the content of the compound represented by the formula (a-1) is not less than 60% by weight (preferably not less than 70% by weight, especially preferably not less than 80% by weight, and most preferably not less than 90% by weight) relative to the total amount of the component (A).

[6] The semiconductor substrate cleaning agent according to any one of [2] to [5], wherein the content of the compound represented by the formula (a-1) is not less than 0.1% by weight (preferably 0.1 to 5% by weight, more preferably 0.1 to 3% by weight, especially preferably 0.1 to 2% by weight, and most preferably 0.2 to 1% by weight) relative to the total amount of the semiconductor substrate cleaning agent.

[7] The semiconductor substrate cleaning agent according to any one of [2] to [6], wherein the rate of the compound represented by the formula (a-2) (preferably a compound represented by the formula (a-2) and having a weight average molecular weight of not less than 1000 and less than 10000 (preferably not less than 800 and less than 10000)) is not less than 60% by weight (preferably not less than 70% by weight, especially preferably not less than 80% by weight, and most preferably not less than 90% by weight) relative to the total amount of the component (A).

[8] The semiconductor substrate cleaning agent according to any one of [2] to [7], wherein the content of the compound represented by the formula (a-2) (preferably a compound represented by the formula (a-2) and having a weight average molecular weight of not less than 1000 and less than 10000 (preferably not less than 800 and less than 10000)) is not less than 0.1% by weight (preferably 0.1 to 5% by weight, more preferably 0.1 to 3% by weight, especially preferably 0.1 to 2% by weight, and most preferably 0.2 to 1% by weight) relative to the total amount of the semiconductor substrate cleaning agent.

[9] The semiconductor substrate cleaning agent according to any one of [2] to [8], wherein the rate of the total content of the compound represented by the formula (a-1) and the compound represented by the formula (a-2) is not less than 60% by weight (preferably not less than 70% by weight, especially preferably not less than 80% by weight, and most preferably not less than 90% by weight) relative to the total amount of the component (A).

[10] The semiconductor substrate cleaning agent according to any one of [2] to [9], wherein the total content of the compound represented by the formula (a-1) and the compound represented by the formula (a-2) is not less than 0.1% by weight (preferably 0.1 to 5% by weight, more preferably 0.1 to 3% by weight, especially preferably 0.1 to 2% by weight, and most preferably 0.2 to 1% by weight) relative to the total amount of the semiconductor substrate cleaning agent.

[11] The semiconductor substrate cleaning agent according to any one of [2] to [10], containing the compound represented by the formula (a-1) and the compound represented by the formula (a-2) and having a weight average molecular weight of not less than 100 and less than 1000 (preferably 100 to 800) as the component (A), at a rate of the compound represented by the formula (a-2) and having a weight average molecular weight of not less than 100 and less than 1000 (preferably 100 to 800) relative to 1 part by weight of the compound represented by the formula (a-1) of 0.01 to 0.50 parts by weight (preferably 0.05 to 0.5 parts by weight and especially preferably 0.05 to 0.3 parts by weight).

[12] The semiconductor substrate cleaning agent according to any one of [2] to [11], wherein the content of the compound represented by the formula (a-2) and having a weight average molecular weight of not less than 100 and less than 1000 (preferably 100 to 800) is 0.001 to not less than 0.3% by weight (preferably 0.001 to 0.2% by weight, especially preferably 0.001 to 0.1% by weight, and most preferably 0.001 to 0.01% by weight) relative to the total amount of the semiconductor substrate cleaning agent.

[13] The semiconductor substrate cleaning agent according to any one of [1] to [12], wherein the component (B) is water having electric conductivity (at 25° C.) of 0.055 to 0.2 µS/cm (preferably 0.056 to 0.1 µS/cm and especially preferably 0.057 to 0.08 µS/cm).

[14] The semiconductor substrate cleaning agent according to any one of [1] to [13], wherein the chloride ion content is 0.01 to 50 ppm.

[15] The semiconductor substrate cleaning agent according to any one of [1] to [14], containing the following component (C):
Component (C): amine.

[16] The semiconductor substrate cleaning agent according to [15], wherein the component (C) is an alkanolamine represented by the formula (c5).

[17] The semiconductor substrate cleaning agent according to [15] or [16], wherein the content of the component (C) is 0.1 to 2.0 parts by weight relative to 1 part by weight of component (A).

[18] The semiconductor substrate cleaning agent according to any one of [1] to [17], containing 0.1 to 3.0 parts by weight of the following component (D) relative to 1 part by weight of component (A):
Component (D): hydrogen peroxide.

[19] A method of producing a semiconductor device, comprising producing a semiconductor device having a multi-layer wiring structure by repeating the following steps:
Step (1): forming a metal wiring via an interlayer insulation film on a semiconductor substrate;
Step (2): subjecting the metal wiring forming surface of the semiconductor substrate to a flattening treatment; and
Step (3): cleaning the semiconductor substrate subjected to the flattening treatment using the semiconductor substrate cleaning agent according to any one of [1] to [18].

INDUSTRIAL APPLICABILITY

The semiconductor substrate cleaning agent of the present invention can remove impurities such as metal polishing dust adhering to a semiconductor substrate without corroding metal forming a wiring and the like and can prevent re-adhesion of the removed impurities. For this reason, in the case of cleaning using the semiconductor substrate cleaning agent of the present invention, remaining of the impurities on the semiconductor substrate can be controlled to a very low level or prevented.

When a semiconductor substrate is cleaned using the semiconductor substrate cleaning agent of the present invention, it is possible to prevent short circuit of wiring and an increase in electrical resistance that have been caused so far by a residue of the impurities, to prevent a decrease in yield, and to efficiently produce a semiconductor device with high accuracy.

The invention claimed is:

1. A semiconductor substrate cleaning agent containing at least the following component (A) and component (B):
Component (A): a water-soluble oligomer having a weight average molecular weight of not less than 100 and less than 10000; and
Component (B): water,
wherein the component (A) comprises at least one compound selected from the group consisting of a compound represented by the formula (a-1) and a compound represented by the formula (a-3):

$$R^{a1}O\text{---}(C_3H_6O_2)_n\text{---}H \qquad (a\text{-}1)$$

wherein $R^{a1}$ denotes a hydrogen atom, a hydrocarbon group having 1 to 18 carbon atoms which may have a hydroxyl group, or an acyl group having 2 to 24 carbon atoms; and n denotes a mean degree of polymerization of the glycerol unit shown in the parentheses and is an integer of 10 to 60; and

$$(R^{a4})_{3\text{-}s}\text{---}N\text{---}[(R^{a5}O)_{n''}\text{---}H]_s \qquad (a\text{-}3)$$

wherein $R^{a4}$ denotes an alkyl group having 1 to 20 carbon atoms; $R^{a5}$ denotes an ethylene group or a propylene group; n" denotes a mean degree of polymerization of the ethylene oxide unit or the propylene oxide unit shown in the round brackets and is an integer of 3 to 15; s denotes 1 or 2; and when s is 1, two $R^{a4}$ may be identical or different, and when s is 2, the two groups in the square brackets may be identical or different.

2. The semiconductor substrate cleaning agent according to claim 1, wherein the content of component (A) is not less than 0.1% by weight relative to the total amount of the semiconductor substrate cleaning agent.

3. The semiconductor substrate cleaning agent according to claim 1, wherein the chloride ion content is 0.01 to 50 ppm.

4. The semiconductor substrate cleaning agent according to claim 1, containing the following component (C):
Component (C): amine.

5. The semiconductor substrate cleaning agent according to claim 4, wherein the component (C) is an alkanolamine represented by the following formula (c5):

(c5)

wherein $R^{c1'}$ and $R^{c2'}$, which are identical or different, are a hydrogen atom or an aliphatic hydrocarbon group; and $R^{c3'}$ is an aliphatic hydrocarbon group having a hydroxyl group.

6. A semiconductor substrate cleaning agent containing at least the following component (A), component (B), and component (C):
Component (A): a water-soluble oligomer having a weight average molecular weight of not less than 100 and less than 10000;
Component (B): water; and
Component (C): amine,
wherein the component (A) comprises at least one compound selected from the group consisting of a compound represented by the formula (a-1) and a compound represented by the formula (a-3):

$$R^{a1}O\text{---}(C_3H_6O_2)_n\text{---}H \qquad (a\text{-}1)$$

wherein $R^{a1}$ denotes a hydrogen atom, a hydrocarbon group having 1 to 18 carbon atoms which may have a hydroxyl group, or an acyl group having 2 to 24 carbon atoms; and n denotes a mean degree of polymerization of the glycerol unit shown in the parentheses and is an integer of 2 to 60; and

$$(R^{a4})_{3\text{-}s}\text{---}N\text{---}[(R^{a5}O)_{n''}\text{---}H]_s \qquad (a\text{-}3)$$

wherein $R^{a4}$ denotes an alkyl group having 1 to 20 carbon atoms; $R^{a5}$ denotes an ethylene group or a propylene group; n" denotes a mean degree of polymerization of the ethylene oxide unit or the propylene oxide unit shown in the round brackets and is an integer of 3 to 15; s denotes 1 or 2; and when s is 1, two $R^{a4}$ may be identical or different, and when s is 2, the two groups in the square brackets may be identical or different, and
wherein the content of component (C) is 0.1 to 2.0 parts by weight relative to 1 part by weight of the component (A).

7. A semiconductor substrate cleaning agent containing at least the following component (A), component (B), and component (D):
Component (A): a water-soluble oligomer having a weight average molecular weight of not less than 100 and less than 10000;
Component (B): water; and
Component (D): hydrogen peroxide,
wherein the component (A) comprises at least one compound selected from the group consisting of a compound represented by the formula (a-1) and a compound represented by the formula (a-3):

$$R^{a1}O\text{—}(C_3H_6O_2)_n\text{—}H \quad (a\text{-}1)$$

wherein $R^{a1}$ denotes a hydrogen atom, a hydrocarbon group having 1 to 18 carbon atoms which may have a hydroxyl group, or an acyl group having 2 to 24 carbon atoms; and n denotes a mean degree of polymerization of the glycerol unit shown in the parentheses and is an integer of 2 to 60; and

$$(R^{a4})_{3-s}\text{—}N\text{—}[(R^{a5}O)_{n''}\text{—}H]_s \quad (a\text{-}3)$$

wherein $R^{a4}$ denotes an alkyl group having 1 to 20 carbon atoms; $R^{a5}$ denotes an ethylene group or a propylene group; n" denotes a mean degree of polymerization of the ethylene oxide unit or the propylene oxide unit shown in the round brackets and is an integer of 3 to 15; s denotes 1 or 2; and when s is 1, two $R^{a4}$ may be identical or different, and when s is 2, the two groups in the square brackets may be identical or different, and wherein the semiconductor substrate cleaning agent contains 0.1 to 3.0 parts by weight of the component (D) relative to 1 part by weight of the component (A).

8. A method of producing a semiconductor device, comprising producing a semiconductor device having a multilayer wiring structure by repeating the following steps:

Step (1): forming a metal wiring via an interlayer insulation film on a semiconductor substrate;

Step (2): subjecting the metal wiring forming surface of the semiconductor substrate to a flattening treatment; and Step (3): cleaning the semiconductor substrate subjected to the flattening treatment by using a semiconductor substrate cleaning agent, wherein the semiconductor substrate cleaning agent contains at least the following component (A) and component (B):

Component (A): a water-soluble oligomer having a weight average molecular weight of not less than 100 and less than 10000; and Component (B): water, wherein the component (A) comprises at least one compound selected from the group consisting of a compound represented by the formula (a-1) and a compound represented by the formula (a-3):

$$R^{a1}O\text{—}(C_3H_6O_2)_n\text{—}H \quad (a\text{-}1)$$

wherein $R^{a1}$ denotes a hydrogen atom, a hydrocarbon group having 1 to 18 carbon atoms which may have a hydroxyl group, or an acyl group having 2 to 24 carbon atoms; and n denotes a mean degree of polymerization of the glycerol unit shown in the parentheses and is an integer of 2 to 60; and

$$(R^{a4})_{3-s}\text{—}N\text{—}[(R^{a5}O)_{n''}\text{—}H]_s \quad (a\text{-}3)$$

wherein $R^{a4}$ denotes an alkyl group having 1 to 20 carbon atoms; $R^{a5}$ denotes an ethylene group or a propylene group; n" denotes a mean degree of polymerization of the ethylene oxide unit or the propylene oxide unit shown in the round brackets and is an integer of 3 to 15; s denotes 1 or 2; and when s is 1, two $R^{a4}$ may be identical or different, and when s is 2, the two groups in the square brackets may be identical or different.

9. A method of producing a semiconductor substrate cleaning agent, comprising mixing a composition containing at least the following component (A) and component (B):

Component (A): a water-soluble oligomer having a weight average molecular weight of not less than 100 and less than 10000; and Component (B): water, wherein the component (A) comprises at least one compound selected from the group consisting of a compound represented by the formula (a-1) and a compound represented by the formula (a-3):

$$R^{a1}O\text{—}(C_3H_6O_2)_n\text{—}H \quad (a\text{-}1)$$

wherein $R^{a1}$ denotes a hydrogen atom, a hydrocarbon group having 1 to 18 carbon atoms which may have a hydroxyl group, or an acyl group having 2 to 24 carbon atoms; and n denotes a mean degree of polymerization of the glycerol unit shown in the parentheses and is an integer of 10 to 60; and

$$(R^{a4})_{3-s}\text{—}N\text{—}[(R^{a5}O)_{n''}\text{—}H]_s \quad (a\text{-}3)$$

wherein $R^{a4}$ denotes an alkyl group having 1 to 20 carbon atoms; $R^{a5}$ denotes an ethylene group or a propylene group; n" denotes a mean degree of polymerization of the ethylene oxide unit or the propylene oxide unit shown in the round brackets and is an integer of 3 to 15; s denotes 1 or 2; and when s is 1, two $R^{a4}$ may be identical or different, and when s is 2, the two groups in the square brackets may be identical or different.

10. The method of producing a semiconductor substrate cleaning agent according to claim 9, wherein the content of component (A) is not less than 0.1% by weight relative to the total amount of the composition.

11. The method of producing a semiconductor substrate cleaning agent according to claim 9, wherein the chloride ion content is 0.01 to 50 ppm relative to the total amount of the composition.

12. The method of producing a semiconductor substrate cleaning agent according to claim 9, wherein the composition containing the following component (C):

Component (C): amine.

13. The method of producing a semiconductor substrate cleaning agent according to claim 12, wherein the component (C) is an alkanolamine represented by the following formula (c5):

$$\begin{array}{c} N \\ R^{c1'} \diagup | \diagdown R^{c3'} \\ R^{c2'} \end{array} \quad (c5)$$

wherein $R^{c1'}$ and $R^{c2'}$, which are identical or different, are a hydrogen atom or an aliphatic hydrocarbon group; and $R^{c3'}$ is an aliphatic hydrocarbon group having a hydroxyl group.

14. The method of producing a semiconductor substrate cleaning agent according to claim 12, wherein the content of component (C) is 0.1 to 2.0 parts by weight relative to 1 part by weight of component (A).

15. The method of producing a semiconductor substrate cleaning agent according to claim 9, wherein the composition containing 0.1 to 3.0 parts by weight of the following component (D) relative to 1 part by weight of component (A):

Component (D): hydrogen peroxide.

16. The semiconductor substrate cleaning agent according to claim 1, wherein the content of the compound represented by the formula (a-1) is 0.1 to 5% by weight relative to the total amount of the semiconductor substrate cleaning agent.

17. A semiconductor substrate cleaning agent containing at least the following component (A) and component (B):

Component (A): a water-soluble oligomer having a weight average molecular weight of not less than 100 and less than 10000, and Component (B): water, wherein the component (A) comprises a compound represented by the formula (a-1) and optionally a compound represented by the formula (a-3):

$$R^{a1}O-(C_3H_6O_2)_n-H \quad \text{(a-1)}$$

wherein $R^{a1}$ denotes a hydrogen atom, a hydrocarbon group having 1 to 18 carbon atoms which may have a hydroxyl group, or an acyl group having 2 to 24 carbon atoms; and n denotes a mean degree of polymerization of the glycerol unit shown in the parentheses and is an integer of 2 to 60; and $$(R^{a4})_{3-s}-N-[(R^{a5}O)_{n''}-H]_s \quad \text{(a-3)}$$

wherein $R^{a4}$ denotes an alkyl group having 1 to 20 carbon atoms; $R^{a5}$ denotes an ethylene group or a propylene group; n" denotes a mean degree of polymerization of the ethylene oxide unit or the propylene oxide unit shown in the round brackets and is an integer of 3 to 15; s denotes 1 or 2; and when s is 1, two $R^{a4}$ may be identical or different, and when s is 2, the two groups in the square brackets may be identical or different, wherein the component (A) further comprises a compound represented by the formula (a-2):

$$R^{a2}O-(R^{a3}O)_{n'}-H \quad \text{(a-2)}$$

wherein $R^{a2}$ denotes a hydrogen atom, a hydrocarbon group having 1 to 18 carbon atoms, or an acyl group having 2 to 24 carbon atoms; $R^{a3}$ denotes an ethylene group or a propylene group; and n' denotes a mean degree of polymerization of the ethylene oxide unit or the propylene oxide unit shown in the parentheses and is an integer of 2 to 60; and the content of the compound represented by the formula (a-2) is 0.01 to 0.50 parts by weight relative to 1 part by weight of the compound represented by the formula (a-1).

\* \* \* \* \*